(12) United States Patent
Hoegerl et al.

(10) Patent No.: US 10,522,433 B2
(45) Date of Patent: Dec. 31, 2019

(54) LAMINATE PACKAGE OF CHIP ON CARRIER AND IN CAVITY

(71) Applicant: Infineon Technologies AG, Neubiberg (DE)

(72) Inventors: Juergen Hoegerl, Regensburg (DE); Horst Theuss, Wenzenbach (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/487,942

(22) Filed: Apr. 14, 2017

(65) Prior Publication Data

US 2017/0316994 A1 Nov. 2, 2017

(30) Foreign Application Priority Data

Apr. 15, 2016 (DE) .................. 10 2016 107 031

(51) Int. Cl.
| | |
|---|---|
| *H01L 23/051* | (2006.01) |
| *H01L 23/06* | (2006.01) |
| *H01L 21/48* | (2006.01) |
| *H01L 23/00* | (2006.01) |
| *H01L 21/56* | (2006.01) |
| *H01L 23/31* | (2006.01) |

(Continued)

(52) U.S. Cl.
CPC ........ *H01L 23/051* (2013.01); *H01L 21/4875* (2013.01); *H01L 21/56* (2013.01); *H01L 23/06* (2013.01); *H01L 23/13* (2013.01); *H01L 23/142* (2013.01); *H01L 23/3135* (2013.01); *H01L 23/488* (2013.01); *H01L 23/5389* (2013.01); *H01L 24/05* (2013.01); *H05K 1/185* (2013.01); *H01L 23/3121* (2013.01); *H01L 24/29* (2013.01);

(Continued)

(58) Field of Classification Search
CPC ....... H01L 23/051; H01L 23/06; H01L 21/48; H01L 23/00; H01L 21/56; H01L 23/31; H01L 23/3135; H01L 24/05; H01L 24/29; H01L 24/32; H01L 21/05666; H01L 2224/05666; H01L 2224/05647; H01L 2224/05582; H01L 2224/05193; H01L 2224/05147; H01L 2224/05124; H01L 2224/05684
USPC ......................................... 257/773, 774, 762
See application file for complete search history.

(56) References Cited

U.S. PATENT DOCUMENTS

| | | | |
|---|---|---|---|
| 4,715,190 A | 12/1987 | Han et al. | |
| 8,927,339 B2 * | 1/2015 | Lin ..................... | H01L 21/4878 438/118 |

(Continued)

FOREIGN PATENT DOCUMENTS

| | | |
|---|---|---|
| DE | 3639639 A1 | 5/1987 |
| DE | 3 639 630 A1 | 6/1988 |

(Continued)

OTHER PUBLICATIONS

English language abstract of DE 3 639 630 A1.
English language abstracts for cited documents DE 10 2013 114 472 A1, DE 10 2011 000 751 A1 and DE 3 639 639 A1.

*Primary Examiner* — Alexander O Williams

(57) ABSTRACT

A package which comprises a chip carrier made of a first material, a body made of a second material differing from the first material and being arranged on the chip carrier so as to form a cavity, a semiconductor chip arranged at least partially in the cavity, and a laminate encapsulating at least one of at least part of the chip carrier, at least part of the body and at least part of the semiconductor chip.

26 Claims, 7 Drawing Sheets

(51) Int. Cl.
*H01L 23/13* (2006.01)
*H01L 23/14* (2006.01)
*H01L 23/488* (2006.01)
*H01L 23/538* (2006.01)
*H05K 1/18* (2006.01)
*H05K 3/46* (2006.01)

(52) U.S. Cl.
CPC .... *H01L 24/32* (2013.01); *H01L 2224/04026* (2013.01); *H01L 2224/05124* (2013.01); *H01L 2224/05147* (2013.01); *H01L 2224/05193* (2013.01); *H01L 2224/05582* (2013.01); *H01L 2224/05644* (2013.01); *H01L 2224/05647* (2013.01); *H01L 2224/05666* (2013.01); *H01L 2224/05684* (2013.01); *H01L 2224/18* (2013.01); *H01L 2224/29111* (2013.01); *H01L 2224/29139* (2013.01); *H01L 2224/29144* (2013.01); *H01L 2224/29147* (2013.01); *H01L 2224/32225* (2013.01); *H01L 2224/32257* (2013.01); *H01L 2924/01014* (2013.01); *H01L 2924/15153* (2013.01); *H05K 3/4652* (2013.01); *H05K 3/4697* (2013.01)

(56) References Cited

U.S. PATENT DOCUMENTS

| | | | |
|---|---|---|---|
| 8,952,489 B2* | 2/2015 | Elian | H01L 23/5389 257/531 |
| 9,263,814 B2* | 2/2016 | Yoshida | C25D 5/12 |
| 9,704,780 B2* | 7/2017 | Marimuthu | H01L 24/19 |
| 9,929,100 B2* | 3/2018 | Lee | H01L 23/5389 |
| 2008/0265395 A1* | 10/2008 | Hasegawa | H01L 23/043 257/690 |
| 2010/0159647 A1* | 6/2010 | Ito | H01L 23/49822 438/124 |
| 2011/0115071 A1* | 5/2011 | Smeys | H01L 21/4853 257/698 |
| 2011/0198743 A1 | 8/2011 | Nikitin et al. | |
| 2014/0175624 A1* | 6/2014 | Palm | H01L 24/96 257/666 |
| 2014/0353838 A1* | 12/2014 | Lin | H01L 24/97 257/773 |
| 2015/0115458 A1* | 4/2015 | Palm | H01L 24/31 257/774 |
| 2015/0206848 A1* | 7/2015 | Boja | H01L 21/563 257/774 |
| 2016/0284642 A1* | 9/2016 | Ganesan | H01L 25/0655 |
| 2016/0307847 A1* | 10/2016 | Lee | H01L 23/5389 |
| 2017/0133352 A1* | 5/2017 | Lin | H01L 25/0657 |
| 2017/0330814 A1* | 11/2017 | Kang | H01L 23/3128 |

FOREIGN PATENT DOCUMENTS

| | | |
|---|---|---|
| DE | 102011000751 A1 | 12/2011 |
| DE | 102013114472 A1 | 6/2014 |

* cited by examiner

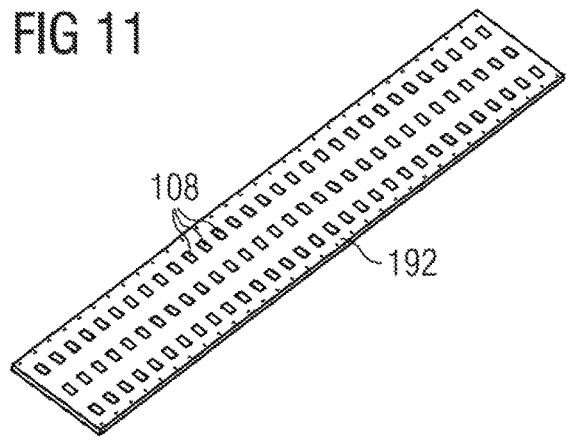
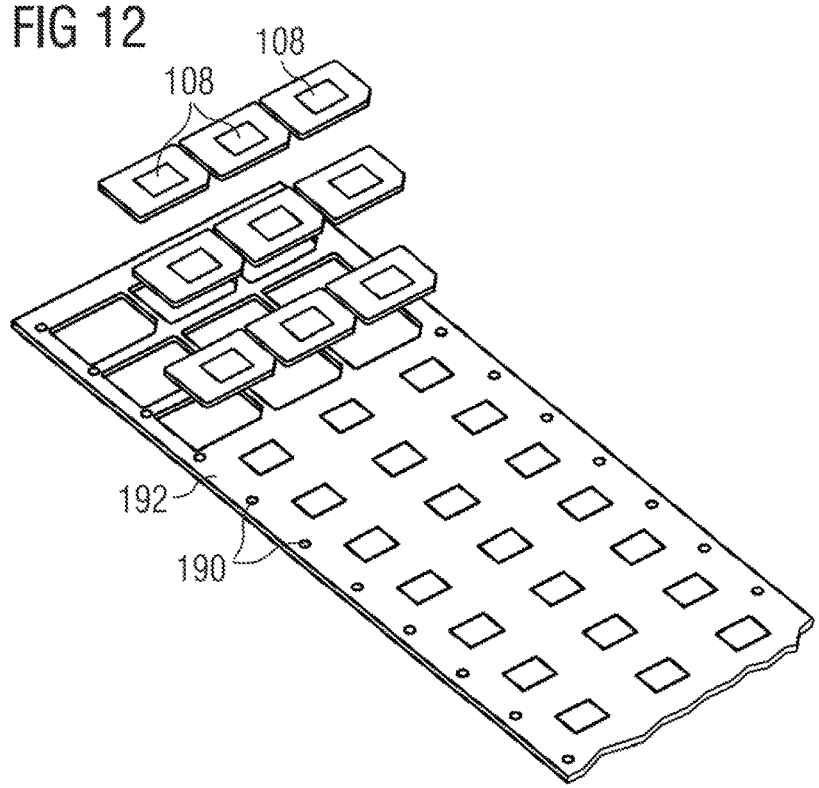
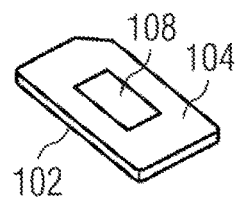

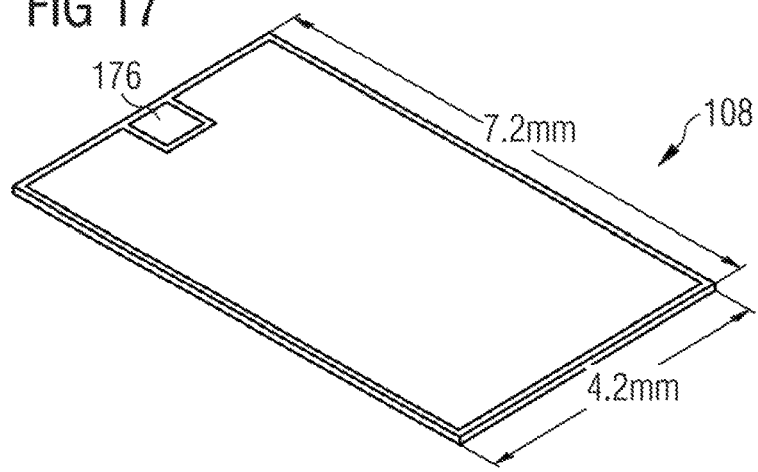
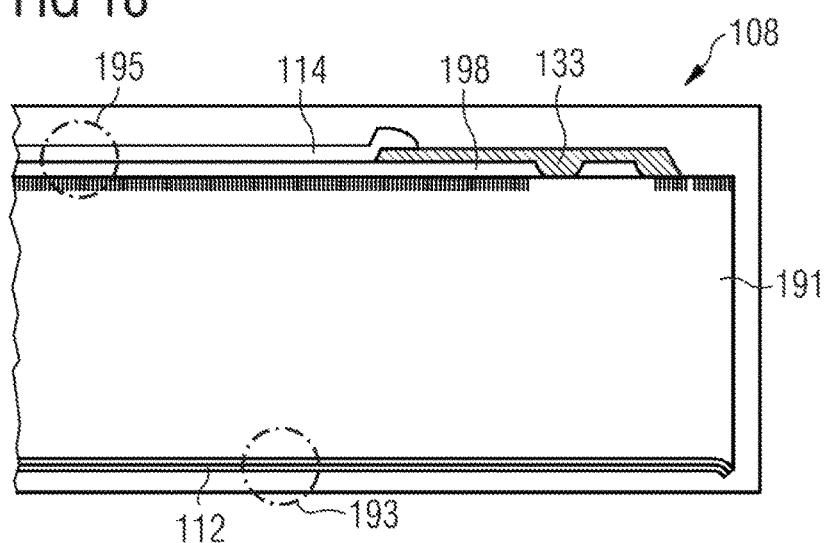
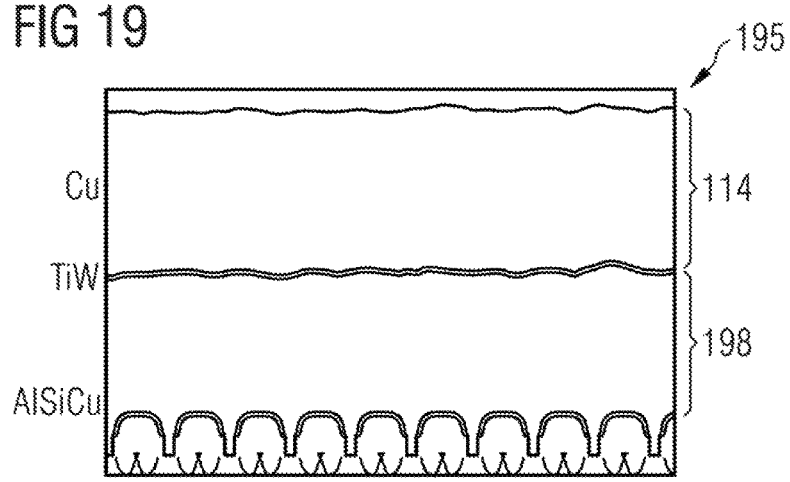

LAMINATE PACKAGE OF CHIP ON CARRIER AND IN CAVITY

BACKGROUND

Technical Field

Various embodiments relate generally to a package, an arrangement, and methods of manufacturing a package.

Description of the Related Art

Conventional packages, such as mold structures, for electronic chips have evolved to a level where the package no longer significantly impedes the performance of the electronic chips. Such electronic chips can be mounted on a leadframe, and an opposing main surface of the electronic chips may be connected to the leadframe by a bond wire.

However, there is still room for improving packaging of chips in terms of reliability and efficiency.

SUMMARY

There may be a need for a reliably operating and simply manufacturable package.

According to an exemplary embodiment, a package is provided which comprises a chip carrier made of a first material, a body made of a second material differing from the first material and being arranged on the chip carrier so as to form a cavity, a semiconductor chip arranged at least partially in the cavity, and a laminate encapsulating at least one of at least part of the chip carrier, at least part of the body and at least part of the semiconductor chip.

According to another exemplary embodiment, an arrangement is provided which comprises a package having the above-mentioned features, and a mounting base on and/or in which the package is mounted.

According to still another exemplary embodiment, a method of manufacturing a package is provided which comprises providing a chip carrier made of a first material, arranging a body made of a second material differing from the first material on the chip carrier so as to form a cavity, arranging a semiconductor chip at least partially in the cavity, and encapsulating at least one of at least part of the chip carrier, at least part of the body and at least part of the semiconductor chip by a laminate.

According to yet another exemplary embodiment, a method of manufacturing a package is provided which comprises providing a chip carrier, arranging a body on the chip carrier so as to form a cavity, arranging a semiconductor chip at least partially in the cavity, subsequently roughening at least one of at least part of the chip carrier, at least part of the body, and at least part of the semiconductor chip, and encapsulating at least one of at least part of the chip carrier, at least part of the body and at least part of the semiconductor chip.

According to an exemplary embodiment of the invention, a packaging architecture is provided in which a chip arranged in a cavity defined by a chip carrier in combination with an annular body thereon is encapsulated by lamination. Highly advantageously, a first material of the chip carrier and a second material of the body defining the cavity thereon are different from one another. This provides freedom to select both materials individually in accordance with the respective function thereof. In particular, the first material may be freely selected to serve as a proper basis for (in particular galvanically) depositing the second material thereon. Correspondingly, the second material may be specifically adapted to be highly appropriate for being formed (in particular galvanically deposited) on the first material. By taking this measure, processability in terms of formation in particular of the body (by galvanic deposition) may be significantly improved and the intrinsic adhesion between the chip carrier and the body may be rendered reliable. This also has an advantageous impact on the reliability of the package as a whole, since the body and the chip carrier are safely prevented from being delaminated or detached from one another during applying mechanical pressure during the lamination procedure and during operation of the readily manufactured package.

According to another exemplary embodiment, chip carrier and/or body and/or semiconductor chip is or are selectively roughened at a stage of the manufacturing procedure in which the semiconductor chip is already mounted in the cavity defined by chip carrier and body. Thereby, reliability of the subsequent lamination may be promoted and undesired delamination of laminate and the other elements of the package may be safely prevented on the long term. When roughening is carried out after placing the chip in the cavity, it is advantageously possible to roughen multiple surface portions of even multiple ones of chip carrier, body and semiconductor chip together so that a particularly strong improvement of the adhesion can be obtained with a simple and fast procedure in which the mentioned multiple components are all roughened at the same time and in a common procedure.

DESCRIPTION OF FURTHER EXEMPLARY EMBODIMENTS

In the following, further exemplary embodiments of the package, the arrangement and the methods will be explained.

In the context of the present application, the term "package" or module may particularly denote one or more semiconductor chips, optionally comprising one or more other kind of electronic components in addition, embedded within an encapsulant such as a laminate.

In the context of the present application, the term "semiconductor chip" may particularly denote a naked die, i.e. a non-packaged (for instance non-molded) chip made of a processed semiconductor, for instance a singulated piece of a semiconductor wafer. One or more integrated circuit elements (such as a diode, a transistor, etc.) may be formed within the semiconductor chip. Also already encapsulated chips may be used as a semiconductor chip packaged according to an exemplary embodiment.

The first material and/or the second material may be a metallic material or an alloy. Thus, the first material and the second material may in particular be different metallic materials. This allows to properly protect the sensitive semiconductor chip by a metallic surrounding. This allows the semiconductor chip to withstand mechanical load exerted during lamination and during use of the readily manufactured package. Moreover, in particular using a metallic material for the chip carrier allows also to carry out a solder connection between at least one pad of the semiconductor chip and the metallic material of the chip carrier. This further strengthens the mechanical integrity of the arrangement of chip carrier, body and semiconductor chip.

In particular, both the first material and the second material may comprise the same metal, in particular the same major metal. More particularly, both the first material and the second material may comprise copper, however, with different metallic and/or non-metallic additives. This ensures a chemical similarity between the materials of the chip carrier and the material of the body keeping the materials chemically compatible while still allowing for some differences between them to take into account the different particularities of the different functions of the chip carrier and the body. More specifically, similar materials and in particular a common main material of the first material and the second material keep differences between the coefficients of thermal expansion (CTE) of the chip carrier and the body small, thereby preventing thermal load.

In an embodiment, the first material and the second material differ concerning material composition.

For example, the first material may be a rolled copper alloy (such as K80), and can in particular be a composition of copper, iron and phosphor. For instance, the iron portion may be in a range between 0.03 weight percent and 1 weight percent (for example 0.1 weight percent). The phosphor portion may be in a range between 0.01 weight percent and 0.2 weight percent (for example 0.04 weight percent). The rest may be copper material. Alternatively, the first material can also have another composition, for instance can be embodied as K81, i.e. can have a composition of copper and tin. For instance, the tin portion may be in a range between 0.03 weight percent and 1 weight percent (for example 0.1 weight percent). The rest may be copper material. More generically, the first material can comprise at least 95%, in particular at least 99%, copper and the rest may be one or more additives, in particular selected from the group consisting of iron, tin and phosphor.

In an embodiment, the second material may comprise copper with a small amount of additive materials, in particular less than 5% of additives, more particularly at least 1% of additives. The additives may be specifically selected to promote a galvanic deposition of the second material on the first material for improving processability.

In an embodiment, both the first material and the second material comprise copper, in particular comprise different copper alloys. This allows a proper electrical and thermal conductivity. More generally, the first material and the second material may be different alloys with the same main metal (such as copper, nickel, aluminum). In particular, the first material and the second material may comprise the same main metal and different additives. In this context, the term "main metal" may denote the metal which provides a major contribution (for instance more than 50 weight percent, in particular at least 90 weight percent) to the entire chip carrier or body, respectively. This keeps the differences of the CTE values between chip carrier and body small.

In an embodiment, the semiconductor chip comprises a solderable layer on a main surface being in contact with the chip carrier. When such a solderable layer is provided on a main surface of the semiconductor chip facing the chip carrier, a mechanical and electrical connection between chip carrier and chip may be accomplished by soldering. This promotes the electric connectivity with small effort, keeps the package small and simultaneously increases mechanical robustness.

In an embodiment, the solderable layer comprises at least one of the group consisting of a copper-tin-alloy, a gold-tin alloy, and a silver-tin alloy. However, other materials are possible as well.

In an embodiment, the semiconductor chip comprises an electrically conductive contact structure on a main surface being in contact with the laminate. For instance, the semiconductor chip may be arranged face up, i.e. with its active surface facing towards the exterior laminate layer or layers.

Alternatively, for instance when semiconductor chips with a vertical current flow, power semiconductor chips, etc. are implemented, it is also possible that both sides of the semiconductor chips have electric contacts. Also a face-down architecture is possible which embodiments of the invention.

In an embodiment, the body is configured as an annular structure surrounding the cavity. Such an annular structure fully circumferentially surrounds the semiconductor chip and therefore provides for a particular reliable mechanical protection.

In an embodiment, the package further comprises a lateral surrounding structure laterally surrounding the chip carrier with body and semiconductor chip and being at least partially encapsulated by the laminate. Further surrounding the in particular annular body can be a lateral surrounding structure, for instance made of electrically insulating material. For example, singularized structures each composed of chip carrier, body and semiconductor chip may be embedded in recesses of a recessed electrically insulating layer or core for manufacturing multiple packages in a batch procedure. In particular, also laminating may be carried out on batch level. Subsequently, the structure composed of multiple arrangements of chip, chip carrier and body, the lateral surrounding structure on batch level and laminate layers on batch level may be singularized, for instance by mechanical cutting, etching or laser cutting. This allows for a particular efficient manufacture of multiple packages with high throughput.

In an embodiment, the laminate is a printed circuit board (PCB) laminate. Thus, the material of the laminate may be in particular on the basis of resin (in particular epoxy resin), if desired mixed with particles (such as fibers, for instance glass fibers). Suitable dielectric materials for the laminate are prepreg or FR4. A suitable electrically conductive material for the laminate is copper.

In an embodiment, the method comprises forming the second material on the first material by plating. In particular, such a plating procedure may be electroplating or electroless plating. Preferably, the plating is accomplished by galvanic plating. With such a procedure, a highly efficient deposition of electrically conductive body material on electrically conductive carrier material is enabled in particular when the two different materials are selected correspondingly to fulfill these tasks.

In an embodiment, the method comprises roughening at least a part of a surface of the first material before forming the second material on the first material. This roughening procedure promotes adhesion of the second material on the first material.

In an embodiment, the method comprises roughening at least a part of a surface of the second material, in particular after arranging the semiconductor chip in the cavity. This promotes adhesion between the body and laminate material.

In an embodiment, the method comprises roughening at least a part of a surface of the semiconductor chip, in particular after arranging the semiconductor chip in the cavity. This promotes adhesion between the semiconductor chip and laminate material.

Carrying out at least part of the roughening procedure(s) after having placed the chip in the cavity allows to roughen all exposed surfaces of the semiconductor chip, chip carrier and body at the same time, and hence highly efficiently in terms of roughening time and improvement of the adhesion.

In an embodiment, the roughening is carried out by chemically roughening. By a corresponding chemical treatment, microprotrusions may be formed on the various elements which increase the active surface and therefore improve the tendency of preventing delamination. As an alternative to a chemical roughening procedure, also a mechanical roughening procedure or a laser roughening is possible.

In an embodiment, the method further comprises forming, in particular drilling, more particularly laser drilling, at least one through hole extending through the laminate to thereby expose a surface of the semiconductor chip. Laser drilling through the laminate material to expose one or more pads of the semiconductor chip is a simple and reliable procedure for quickly and precisely defining electric contacts.

In an embodiment, the method further comprises filling the at least one through hole with electrically conductive material, in particular by plating. For example, copper material may be filled in the through-holes formed by laser drilling, mechanical drilling or the like.

In an embodiment, the body is manufactured by forming a sacrificial structure on a surface portion of the chip carrier, forming the body by applying the second material differing from the first material on another surface portion of the chip carrier being not covered by the sacrificial structure, and subsequently removing the sacrificial structure to thereby form the cavity. The sacrificial structure thereby selectively covers surface portions where later one or more semiconductor chips shall be placed. Remaining surface portions which remain exposed to an environment can therefore be subsequently plated with the second electrically conductive material. Thereafter, the sacrificial structure may be removed (for instance by etching or laser ablation). This is a simple procedure for defining positions of the semiconductor chips and for forming the body.

In an embodiment, the sacrificial structure is made of a photoresist. Such a photoresist may be deposited on the entire surface of the chip carrier and may be subsequently patterned by lithography and etching.

In an embodiment, forming the body by applying the second material is carried out on a first main surface of the chip carrier and simultaneously with forming a further body of the second material on an opposing second main surface of the chip carrier. Thus, the second material may not only be deposited on the main surface of the chip carrier on which subsequently the semiconductor chips are to be placed, but also on an opposing other main surface of the chip carrier. This increases the vertical symmetry of the built-up and therefore increases mechanical stability and prevents bending.

In an embodiment, the method further comprises, prior to the encapsulating, inserting the chip carrier with body and semiconductor chip into a recess in a lateral surrounding structure. Therefore, a lateral surrounding with electrically insulating material may be accomplished before the vertical surrounding of the arrangement of semiconductor chip, body and chip carrier by the laminate.

In an embodiment, the encapsulating further comprises encapsulating at least part of the lateral embedding structure by the laminate. Thus, the laminate may also cover the lateral embedding structure so as to mechanically and electrically decouple the interior of the package from an exterior thereof.

In an embodiment, the semiconductor chip is a power semiconductor chip. Such power semiconductor chips are specifically prone to failure in the event of creep currents or disruptive discharge which may occur under high voltage or high current conditions. Dielectric lamination reliably protects such power semiconductor chips against leaking current. Power semiconductor chips may be used for automotive applications. Power semiconductor chips may comprise, as integrated circuit elements, power transistors and/or diodes.

In an embodiment, the encapsulant comprises a laminate, in particular a printed circuit board laminate. In the context of the present application, the term "laminate structure" may particularly denote an integral flat member formed by electrically conductive structures and/or electrically insulating structures which may be connected to one another by applying a pressing force. The connection by pressing may be optionally accompanied by the supply of thermal energy. Lamination may hence be denoted as the technique of manufacturing a composite material in multiple layers. A laminate can be permanently assembled by heat and/or pressure and/or welding and/or adhesives.

In an embodiment, the package comprises, as chip carrier, a leadframe, carrying the semiconductor chip. Optionally, at least one bond wire may be provided for electrically connecting at least one chip pad with the chip carrier.

In an embodiment, the package is configured as one of the group consisting of a current sensor (in particular a current sensor based on magnetic sensing), a half bridge, a cascode circuit, a circuit constituted by a field effect transistor and a bipolar transistor being connected in parallel to one another, and a power semiconductor circuit. However, also other high current and/or high voltage and/or high power applications are compatible with an exemplary embodiment of the invention.

In an embodiment, the manufacturing method is carried out simultaneously with a plurality of semiconductor chips. Such a batch procedure allows for a very efficient processing and manufacture of packages. Thus, the method may comprise manufacturing a plurality of packages at least partially in a batch procedure as a consecutive/a connected/an integral structure being subsequently singularized into the individual packages or preforms thereof. In particular, one or more of the procedures of forming multiple bodies on a common carrier structure, mounting the semiconductor chips in the cavities, roughening exposed surfaces portions, forming a laterally surrounding structure, laminating, and/or access hole formation and material deposition for formation of the vertical interconnect structures may be performed efficiently for multiple packages in common. After these procedures, the semifinished packages or preforms of packages may be singularized.

In an embodiment, the at least one semiconductor chip is configured as a power semiconductor chip, in particular comprising at least one of the group consisting of a diode, and a transistor, more particularly an insulated gate bipolar transistor. In an embodiment, the device is configured as a power module. For instance, the one or more electronic chips may be used as semi and conductor chips for power applications for instance in the automotive field. In an embodiment, at least one electronic chip may comprise a logic IC or an electronic chip for RF power applications. In one embodiment, the electronic chip(s) may be used as one or more sensors or actuators in microelectromechanical systems (MEMS), for example as pressure sensors or acceleration sensors.

As substrate or wafer for the electronic chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

BRIEF DESCRIPTION OF THE DRAWINGS

The accompanying drawings, which are included to provide a further understanding of exemplary embodiments and constitute a part of the specification, illustrate exemplary embodiments.

In the drawings:

FIG. 1 to FIG. 15 show structures obtained during carrying out a method of manufacturing a package according to an exemplary embodiment.

FIG. 17 shows a three-dimensional view of a semiconductor chip used as a basis for manufacturing a package according to an exemplary embodiment.

FIG. 18 shows a cross-sectional view of a semiconductor chip used as a basis for manufacturing a package according to an exemplary embodiment.

FIG. 19 shows a detail of a top portion of a semiconductor chip used as a basis for manufacturing a package according to an exemplary embodiment.

DETAILED DESCRIPTION

Figure 1:
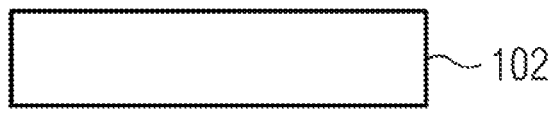

The illustration in the drawing is schematically and not to scale.

Before exemplary embodiments will be described in more detail referring to the figures, some general considerations will be summarized based on which exemplary embodiments have been developed.

According to an exemplary embodiment of the invention, a packaging architecture is provided which allows to roughen the surface of the semiconductor chip, the chip carrier and/or the body after chip placement in the cavity. After manufacturing of the cavity, which may be produced by depositing material (e.g. copper) on the chip carrier, the semiconductor chip may be placed in the cavity. Subsequently, the semiconductor chip and the surface of the deposited material (on both opposing main surfaces of the obtained arrangement) can be roughened, for example in a chemical process.

Further advantageously, a laser drilling can be performed after lamination to expose one or more pads of the semiconductor chip. For such a through-hole formation, the roughened chip carrier with the body and chip can be laminated on both sides, and subsequently the vias may be formed by laser drilling through the laminate. The via holes may then be filled with additional galvanic material in a subsequent procedure, to therefore form vertical interconnects.

A further advantageous aspect of an exemplary embodiment is that provision of the semiconductor chip with a layer of solderable material (for instance copper-tin, gold-tin or silver-tin) on the back side, i.e. at the main surface of the semiconductor chip at which it faces the chip carrier. Such a layer of electrically conductive solderable material may serve as a solder structure. It may for instance have a thickness in a range between 0.5 µm and 10 µm, in particular between 1 µm and 5 µm. It is also possible that the front side of the electronic chip, i.e. the upper main surface facing the laminate, may be provided with an electric contact structure (for instance in form of a copper metallization), for example with a thickness in a range between 0.5 µm and 10 µm, in particular in a range between 1 µm and 5 µm.

According to an exemplary embodiment of the invention, a semiconductor chip may be inserted into a cavity before being embedded. This embedding may be performed by lamination of at least one laminate layer on top and/or on bottom thereof. Electric contacts may be formed by forming laser vias in the laminate. The cavity thereby has the function to compensate for the height and the volume of the semiconductor chip so that applying the laminate does not harm the sensitive chip (in particular to prevent that glass fibers at an edge harm the semiconductor chip). This improves the reliability of the manufactured package. Correspondingly, a further laminate structure serving as lateral surrounding structure may have cut-outs in each of which a respective arrangement of chip carrier, body and semiconductor chip may be inserted prior to lamination. The semiconductor chip may be electrically conductively coupled with the electrically conductive chip carrier such as a lead frame. This is particularly advantageous for vertically conductive power semiconductor chips (for instance implementing integrated circuit elements such as SFETs or JFETs (junction gate field-effect transistor), IGBTs (insulated-gate bipolar transistors), etc.).

In an embodiment, not all semiconductor chips used for a circuit device are placed in a leadframe, but each semiconductor chip is placed on a separate chip carrier (such as a lead frame portion). These chip-related and chip-sized chip carriers can then be placed in cavities of a main board and can be laminated together. This has the advantage that standardized basic cells may be used which can be prefabricated with small effort. Even this allows the individual testing of the semiconductor chips, which results in a high throughput and a high yield.

The manufacture of a cavity in which a semiconductor chip is to be placed can be carried out with a subtractive process or with an additive process. In a subtractive process, the cavity is formed by milling. This procedure is however quite expensive and results in an excessively rough surface which is not compatible with certain die attach procedures. Milling may also generate an undesired rounding in a deepest portion of the cavity which reduces accuracy of placing the semiconductor chips in the cavity. Consequently, such a cavity must be provided with a small tolerance so that resin from the laminate layers fills the cavity.

Hence, manufacturing the cavity in an additive procedure has advantages. In such a procedure, an initially smooth base copper plate may be provided with guide bores to hang such a structure into a copper plating device. In order to promote copper of the plating procedure to properly and continuously deposit on the base copper, it is advantageously possible to chemically pretreat the surface of the base copper plate, in order to remove contamination and oxide. Subsequently, a photoresist layer may be deposited and developed which defines the position and the shape of the subsequent cavity. By deposition of copper comprising material, the cavity may then be formed. This deposited copper comprising material may form the above-mentioned body. The base copper comprising plate, i.e. the above-mentioned chip carrier, may be coated with the copper comprising material on both main surfaces in order to keep warpage of the resulting leadframelike structure small. After removing the photoresist and milling certain outer contours, the chip carrier with body is ready for assembly.

Figure 15:
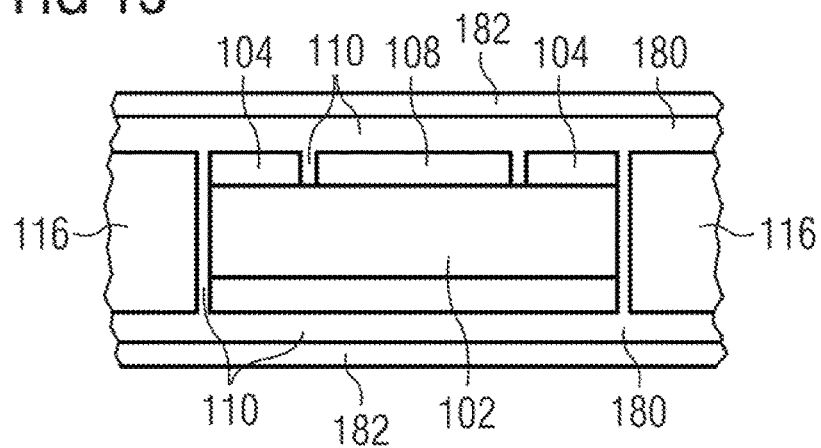
Figure 16:
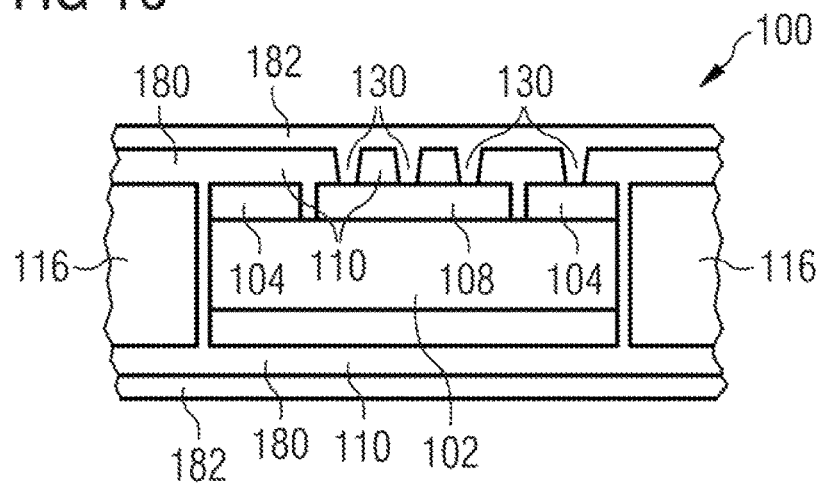
FIG. 16 shows a package according to an exemplary embodiment manufactured in accordance with FIG. 1 to FIG. 15.

FIG. 1 to FIG. 15 show structures obtained during carrying out a method of manufacturing a package 100, shown in FIG. 16, according to an exemplary embodiment. Before describing the manufacturing procedure, the package 100 according to FIG. 16 will be described.

Package 100 shown in FIG. 16 comprises a chip carrier 102 made of a first electrically conductive material in form of a copper alloy (for instance K80, i.e. copper with 0.1% iron and 0.04% phosphor, or K81, i.e. a composition of copper and 0.1% tin) specifically selected to promote proper formation of a galvanically formed second material thereon. The first material may be selected as being properly suitable for forming a basis for subsequent galvanic deposited second material. Moreover, package 100 comprises a body 104 made of a second electrically conductive material differing from the first electrically conductive material. The body 104 is configured as an annular structure fully circumferentially surrounding a cavity 106 for accommodating semiconductor chip 108 to thereby provide a high degree of mechanical protection. In particular, the second electrically conductive material may be another copper alloy (in particular mainly consisting of copper with additives of up to 1 weight percent) which may be specifically selected to be highly appropriate in terms of allowing to galvanically deposit this electrically conductive second material on the previously described electrically conductive first material. The material properties of the first material of the second material can hence be specifically selected to obtain a proper adhesion of the galvanically formed electrically conductive second material of the body 104 on the rolled electrically conductive first material of the chip carrier 102. The separate provision of the first material and the second material not only gives a package designer a high freedom and flexibility during package design, but also renders the additive manufacturing procedure by which the body 104 is formed highly efficiently.

As can be taken from FIG. 16, the body 104 is arranged on the chip carrier 102 so as to delimit cavity 106, i.e. a blind hole within the carrier-body-arrangement.

Semiconductor chip 108, for instance a power semiconductor chip, is arranged in the cavity 106 so that an upper main surface of the semiconductor chip 108 is aligned with or flushes with an upper surface of the body 104. This is advantageous for a lamination procedure carried out during manufacturing the package 100 and ensures a high intrinsic adhesion of the components of the package 100 while mechanically protecting the sensible semiconductor chip 108 during manufacture against damage. Although the package 100 shown in FIG. 16 has only one semiconductor chip 108, it is also possible to place multiple semiconductor chips 108 in the cavity 106 and/or to provide a package 100 having multiple semiconductor chips 108 in different cavities 106.

A laminate 110, which is here composed of a vertically symmetric stack of electrically insulating layers 180 (for instance made based on prepreg) and electrically conductive layers 182 (for instance copper foils) on top and on bottom of the package 100, encapsulates side surfaces of the chip carrier 102, horizontal and side surfaces of the body 104 and horizontal and side surfaces of the semiconductor chip 108.

Although not shown in FIG. 16, the semiconductor chip 108 may comprise a solderable layer 112 (for instance made of a copper-tin-alloy, see FIG. 18 and FIG. 20) on a lower main surface being in contact with the chip carrier 102. In other words, the lower main surface of the semiconductor chip 108 may be soldered on the carrier 102. Thus, the provision of the first material from an electrically conductive material has the advantage that it may form part of a reliable solder connection with the semiconductor chip 108, which may establish a mechanical connection and optionally also an electric connection. Moreover, but not shown in FIG. 16, the semiconductor chip 108 may comprise an electrically conductive contact structure 114 (see FIG. 18 and FIG. 19) on an upper main surface being in contact with the laminate 110.

Furthermore, the package 100 comprises a lateral surrounding structure 116 (for instance part of a recessed FR4 core) laterally surrounding the chip carrier 102 with body 104 and semiconductor chip 108. Side surfaces as well as upper and lower horizontal surfaces of the lateral surrounding structure 116 are also encapsulated by the laminate 110. Resin material of the electrically insulating layers 180 may flow into gaps between the chip-body-carrier arrangement on the one hand and the lateral surrounding structure 116 on the other hand during the lamination, i.e. upon providing mechanical pressure and thermal energy.

Chip pads (not shown) may be electrically connected to an electronic periphery by vias formed by electrically conductive material 130.

In the following, the manufacturing procedure for obtaining package 100 according to FIG. 16 will be explained in detail:

In order to obtain the structure shown in FIG. 1, chip carrier 102 made of the above described first material is provided. The chip carrier 102 shown in FIG. 1 is made of a rolled copper alloy sheet (with additives) with a thickness of 1 mm and a size of 600 mm×600 mm. Hence, although not shown in FIG. 1 to FIG. 8, multiple packages 100 may be manufactured in a batch procedure. In other words, the mentioned copper alloy sheet may form a two-dimensional arrangement of preforms of packages 100.

Figure 2:

In order to obtain the structure shown in FIG. 2, sprocket holes may be drilled in the outer region (not visible in FIG. 2) of the copper sheet forming the chip carrier 102.

Figure 3:

In order to obtain the structure shown in FIG. 3, an exposed surface of the first material is chemically roughened before forming the second material on the first material. More precisely, surface cleaning and surface roughening may be carried out as a preparation for a subsequent plating according to FIG. 3. Roughening may be accomplished by a chemical treatment, or alternatively by a mechanical treatment or a laser treatment or the like.

Figure 4:

In order to obtain the structure shown in FIG. 4, a sacrificial structure 124, here embodied as a layer made of a photoresist, is formed on the upper main surface of the chip carrier 102. For instance, a full layer of photoresist may be laminated on the roughened upper main surface of the chip carrier 102 as sacrificial structure 124.

Figure 5:
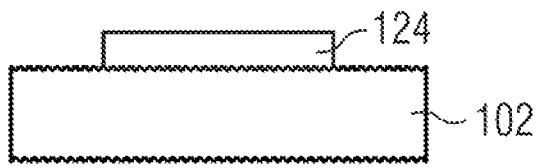

In order to obtain the structure shown in FIG. 5, the sacrificial structure 124 is patterned. After exposing and developing the photoresist layer forming the sacrificial structure 124, the latter is partially removed from the upper main surface of the chip carrier 102 so as to remain selectively only on a surface portion of the chip carrier 102 which corresponds to a later mounting position of the semiconductor chip 108.

Figure 6:
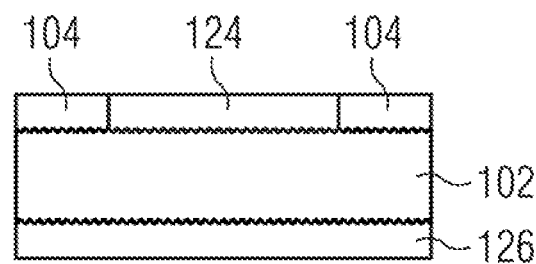

In order to obtain the structure shown in FIG. 6, the above described second material forming the body 104 is formed on the chip carrier 102 for example by plating. More precisely, the body 104 is formed by applying the second material differing from the first material on an exposed surface portion of the chip carrier 102 being not covered by the sacrificial structure 124. Thus, the sacrificial structure 124 functions as a mask defining the position of the body 104. As can be taken from FIG. 6, forming the body 104 by applying the second material is carried out on an upper first main surface of the chip carrier 102 and simultaneously with the formation of a further (here layer-shaped) body 126 of the second material on an opposing lower second main surface of the chip carrier 102. In order to obtain the structure shown in FIG. 6, double-sided plating of the structure according to FIG. 5 is carried out, for instance by a galvanic treatment. Apart from the surface covered with the sacrificial structure 124, the other roughened surface portions of the structure according to FIG. 5 are all covered with the second material to thereby form body 104 and further body 126. The second material can be copper with additives of less than 1% to promote proper processability during the galvanic deposition.

Figure 7:
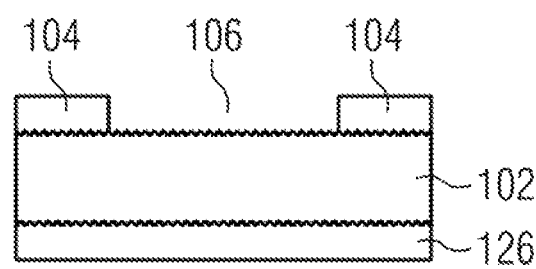

In order to obtain the structure shown in FIG. 7, the sacrificial structure 124 is subsequently completely removed to thereby form the cavity 106. Removal of the photoresist as sacrificial structure 124 can be carried out by etching, for instance with caustic soda.

Figure 8:
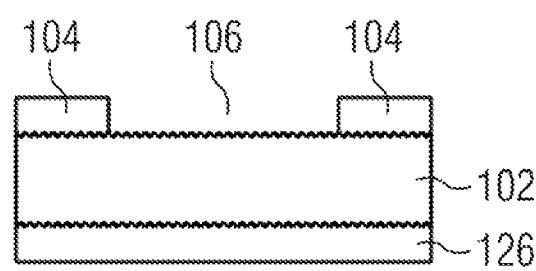

In order to obtain the structure shown in FIG. 8, although not shown in FIG. 8, individual sprocket holes may be drilled, and strip-shaped sheets 192 or leadframes may be formed as separated singularized pieces. Strip sizes of for instance 62 mm×260 mm may be defined.

Figure 9:
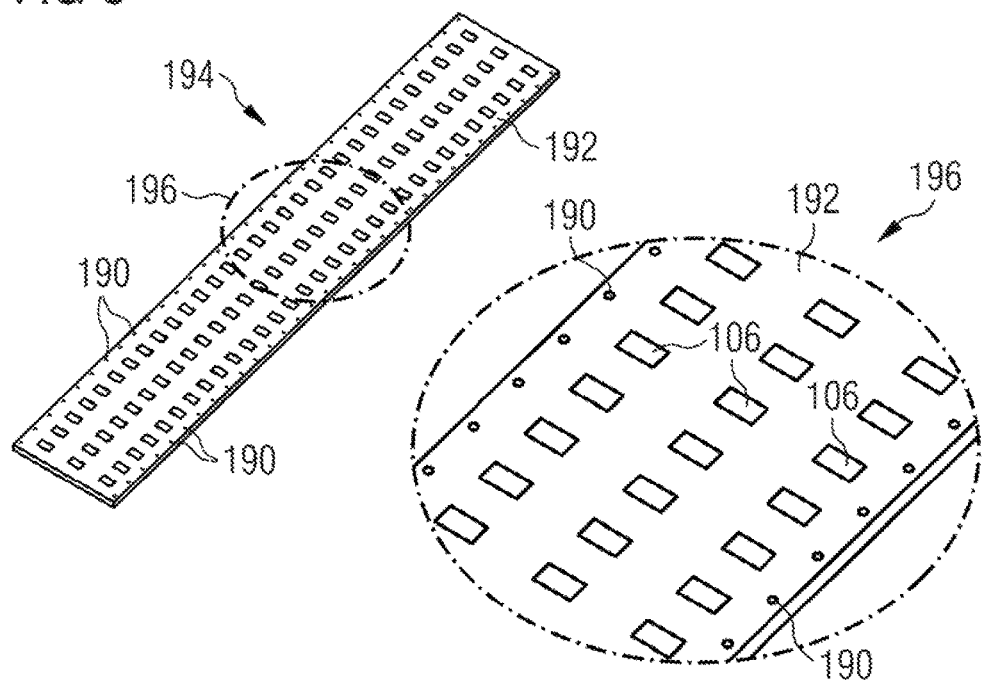

The structure shown in FIG. 9, illustrates the sprocket holes 190 and the cavities 106 in strip-shaped sheet 192. In other words, FIG. 9 shows an overview 194 and a detail 196 a three-dimensional view of what is obtained after carrying out the previously described procedure.

Figure 10:
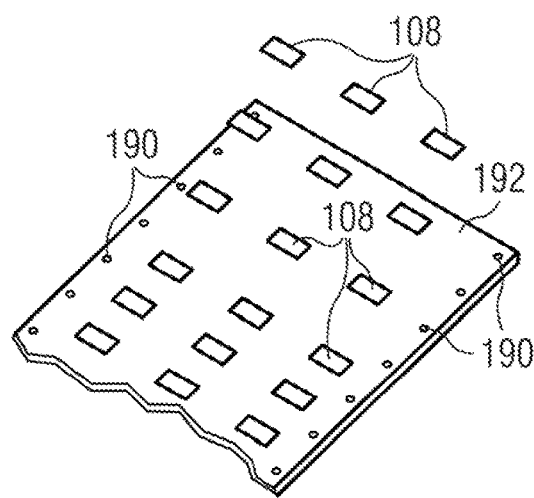

In order to obtain the structure shown in FIG. 10, a plurality of semiconductor chips 108 are placed in the cavities 106 of the sheet 192, in the shown embodiment one semiconductor chip 108 per cavity 106. Hence, the structure shown in FIG. 9 may be subject to a die attach procedure.

The result of the procedure described above referring to FIG. 10 is shown in FIG. 11. Thereafter, an electric test can be carried out. Strip testing, component level testing, including multi-needle avalanche testing, etc., can be carried out.

Subsequently, as shown in FIG. 12, singulation of individual carrier-body-chip arrangements from the batch structure of FIG. 11 can be carried out. This may be done by outline punching. It is possible that at the present stage of the manufacturing procedure, an automatic optical inspection and/or a tray sorting procedure is or are carried out.

FIG. 13 shows an already singularized arrangement of chip carrier 102, body 104 as well as semiconductor chip 108 placed in the cavity 106 defined between chip carrier 102 and body 104. In order to obtain roughened carrier-body-chip arrangements shown in FIG. 13, roughening of an exposed surface of the second material of the body 104, of an exposed surface of the first material of the carrier 102, and an exposed surface of the semiconductor chip 108 in the cavity 106 is carried out. Advantageously, these common and simultaneous roughening procedures of the mentioned multiple surfaces are carried out after placing the semiconductor chips 108 in the cavities 106 of the carrier body arrangement, because this accelerates the manufacturing time. Moreover, roughening all the mentioned surfaces strengthens a cohesion of the laminate 110 and the chip-carrier-body arrangement. Preferably, the roughening is carried out by chemically roughening. Additionally or alternatively, roughening may however also be carried out by a mechanical treatment, a laser treatment, and/or a plasma treatment. Thus, surface roughening of exposed chip surfaces and of exposed carrier surfaces as well as of exposed body surfaces may be carried out. All these surfaces may be roughened in a common procedure, and hence highly efficiently. By taking this measure, the reliability of a subsequently formed lamination connection may be enhanced.

Figure 14:
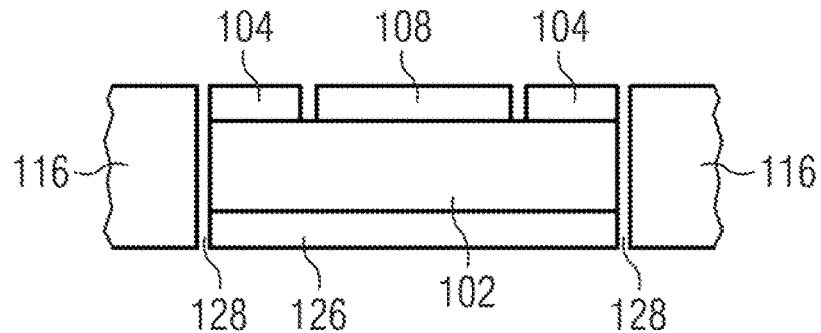

In order to obtain the structure shown in FIG. 14, the chip-carrier-body arrangements of FIG. 13, i.e. the constituents composed of chip carrier 102 with body 104 and semiconductor chip 108, are placed or inserted into a recess 128 in form of a through hole extending vertically through a lateral surrounding structure 116.

Additionally or alternatively to the roughening procedure carried out as described above referring to FIG. 13, it is also possible to subsequently roughen the chip carrier 102, the body 104, and the semiconductor chip 108 only after having placed the corresponding arrangement within the lateral surrounding structure 116, i.e. in the state shown in FIG. 14. Small gaps remain between side surfaces of the lateral surrounding structure 116 and the chip-carrier-body arrangement after having inserted the latter into the respective recess 128. As can be taken from FIG. 14, the arrangements of FIG. 13, after or prior to roughening, are placed in the through-hole type recesses 128 formed in lateral surrounding structure 116, for instance in a FR4 core with cut-outs. This can be done on batch level. In other words, a core with multiple recesses 128 may be provided as lateral surrounding structure 116 for multiple arrangements together for manufacturing multiple packages 100 at the same time. The packages 100 can be singularized after the lamination procedure and optionally after a vertical interconnect formation described in the following.

In order to obtain the structure shown in FIG. 15, the chip-carrier-body arrangements in the recesses 128, each composed of a respective one of the chip carrier 102 portions, a respective one of the bodies 104, a respective one of the semiconductor chips 108 and a portion of the lateral surrounding structure 116, are encapsulated or interconnected to one another by laminating them with a laminate 110.

As can be taken from FIG. 15, the arrangement of FIG. 14 may be laminated using electrically insulating layers 180 (such as prepreg layers) and electrically conductive layers 182 (such as copper foils), to thereby form the semifinished product shown in FIG. 15. During the lamination, resin material (or other flowable material) of the electrically insulating layers 180 may flow in the small gaps between the side surfaces of the lateral surrounding structure 116 and the chip-carrier-body arrangements.

In order to obtain the package 100 shown in FIG. 16, chip interconnects are manufactured using copper-plated laser vias. Consequently, the method may further comprise laser drilling through holes extending through an upper section of the laminate 110 to thereby expose one or more pads (not shown) at an upper main surface of the semiconductor chips 108. Subsequently, the formed through holes may be filled with electrically conductive material 130 such as copper by plating, to thereby form plated vias.

FIG. 17 shows a three-dimensional view of a semiconductor chip 108 used as a basis for manufacturing a package 100 according to an exemplary embodiment. Reference numeral 176 shows a gate pad enlarged to 600 μm×600 μm.

FIG. 18 shows a cross-sectional view of a semiconductor chip 108 used as a basis for manufacturing a package 100 according to an exemplary embodiment.

As can be taken from the cross-sectional view of the semiconductor chip 108 in FIG. 18, an initial pad 198 (for instance an aluminum silicon copper pad) may be covered by an additional copper layer, see electrically conductive contact structure 114. Furthermore, a detail 193 of a layer stack covering a lower main surface of semiconductor structure 191 of semiconductor chip 108 as well as a detail 195 of a layer stack covering an upper main surface of the semiconductor structure 191 of semiconductor chip 108 are indicated in FIG. 18. The detail 193 shows a solderable layer 112 which may be formed for instance based on a gold-tin alloy. A polyimide layer 133 is shown as well.

FIG. 19 shows detail 195 of the top portion of the semiconductor chip 108 according to FIG. 18 used as a basis for manufacturing a package 100 according to an exemplary embodiment. FIG. 19 hence shows a chip front side metallization.

Figure 20A:
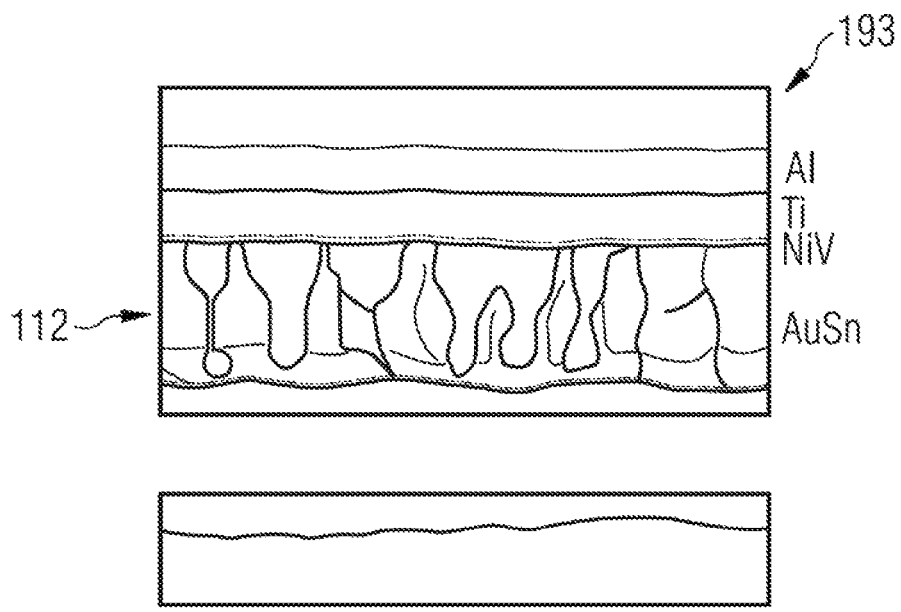
FIGS. 20A and 20B show a detail of a bottom portion of a semiconductor chip used as a basis for manufacturing a package according to an exemplary embodiment.
Figure 20B:
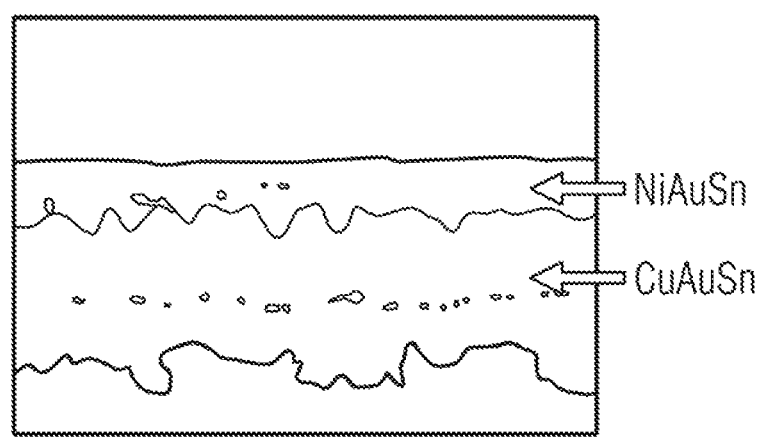

FIG. 20A shows detail 193 of the bottom portion of the semiconductor chip 108 according to FIG. 18 used as a basis for manufacturing a package 100 according to an exemplary embodiment. FIG. 20A hence shows a chip back side metallization. FIG. 20A relates to a state before soldering, whereas FIG. 20B relates to a state after soldering at 350° C. at a pressure of 3 N/mm². FIG. 20B shows a NiAuSn layer on a CuAuSn layer.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A package, comprising:
 a chip carrier made of a first material;
 a body made of a second material differing from the first material and being arranged on the chip carrier so as to form a cavity;
 a semiconductor chip arranged at least partially in the cavity;
 a laminate encapsulating at least one of at least part of the chip carrier, at least part of the body and at least part of the semiconductor chip;
wherein the first material and the second material are different alloys with the same main metal;
 a lateral surrounding structure laterally surrounding the chip carrier with body and semiconductor chip and being at least partially encapsulated by the laminate,
 wherein the lateral surrounding structure is made of electrically insulating material.

2. The package according to claim 1, wherein both the first material and the second material comprises copper, in particular comprise different copper alloys.

3. The package according to claim 1, wherein the first material and the second material comprise the same main metal and different additives.

4. The package according to claim 1, wherein the semiconductor chip comprises a solderable layer on a main surface being in contact with the chip carrier.

5. The package according to claim 4, wherein the solderable layer comprises at least one of the group consisting of a copper-tin-alloy, a gold-tin alloy, and a silver-tin alloy.

6. The package according to claim 1, wherein the semiconductor chip comprises an electrically conductive contact structure on a main surface being in contact with the laminate.

7. The package according to claim 1, wherein the body is configured as an annular structure surrounding the cavity.

8. The package according to claim 1, wherein the laminate is a printed circuit board laminate.

9. An arrangement, comprising:
 a package according to claim 1;
 a mounting base on and/or in which the package is mounted.

10. A method of manufacturing a package, the method comprising:
 providing a chip carrier made of a first material;
 arranging a body made of a second material differing from the first material on the chip carrier so as to form a cavity;
 arranging a semiconductor chip at least partially in the cavity;
 encapsulating at least one of at least part of the chip carrier, at least part of the body and at least part of the semiconductor chip by a laminate;
wherein the first material and the second material are different alloys with the same main metal;
 laterally surrounding the chip carrier with body and semiconductor chip by a lateral surrounding structure;
 wherein the lateral surrounding structure is at least partially encapsulated by the laminate,
 wherein the lateral surrounding structure is made of electrically insulating material.

11. The method according to claim 10, wherein the method comprises forming the second material on the first material by plating, in particular by galvanic plating.

12. The method according to claim 10, wherein the method comprises roughening at least a part of a surface of the first material before forming the second material on the first material.

13. The method according to claim 10, wherein the method comprises roughening at least a part of a surface of the second material, in particular after arranging the semiconductor chip in the cavity.

14. The method according to claim 10, wherein the method comprises roughening at least a part of a surface of the semiconductor chip, in particular after arranging the semiconductor chip in the cavity.

15. The method according to claim 12, wherein the roughening is carried out by chemically roughening.

16. The method according to claim 10, wherein the method further comprises forming, in particular drilling, more particularly laser drilling, at least one through hole extending through the laminate to thereby expose a surface of the semiconductor chip.

17. The method according to claim 16, wherein the method further comprises filling the at least one through hole with electrically conductive material, in particular by plating.

18. The method according to claim 10, wherein the body is manufactured by:
 forming a sacrificial structure on a surface portion of the chip carrier;
 forming the body by applying the second material on another surface portion of the chip carrier being not covered by the sacrificial structure;
 subsequently removing the sacrificial structure to thereby form the cavity.

19. The method according to claim 10, wherein forming the body by applying the second material is carried out on a first main surface of the chip carrier and simultaneously with forming a further body of the second material on an opposing second main surface of the chip carrier.

20. The method according to claim 10, wherein the method further comprises, prior to the encapsulating, inserting the chip carrier with body and semiconductor chip into a recess in a lateral surrounding structure.

21. The method according to claim 20, wherein the encapsulating further comprises encapsulating at least part of the lateral embedding structure by the laminate.

22. A method of manufacturing a package, the method comprising:
   providing a chip carrier made of a first material;
   arranging a body made of a second material on the chip carrier so as to form a cavity;
   arranging a semiconductor chip at least partially in the cavity;
   subsequently roughening at least one of at least part of the chip carrier, at least part of the body, and at least part of the semiconductor chip;
   encapsulating at least one of at least part of the chip carrier, at least part of the body and at least part of the semiconductor chip;
   wherein the first material and the second material are different alloys with the same main metal;
   laterally surrounding the chip carrier with body and semiconductor chip by a lateral surrounding structure;
   wherein the lateral surrounding structure is at least partially encapsulated by the laminate,
   wherein the lateral surrounding structure is made of electrically insulating material.

23. The method according to claim 22, further comprising:
   forming a lateral surrounding structure laterally surrounding the chip carrier with body and semiconductor chip.

24. The method according to claim 23, wherein the lateral surrounding structure is made of FR4 material.

25. The method according to claim 23, further comprising:
   prior to the encapsulating, inserting the chip carrier with body and semiconductor chip into a recess in the lateral surrounding structure.

26. The method according to claim 24, further comprising:
   prior to the encapsulating, inserting the chip carrier with body and semiconductor chip into a recess in the lateral surrounding structure.

* * * * *